US009024206B2

(12) United States Patent
Park et al.

(10) Patent No.: US 9,024,206 B2
(45) Date of Patent: May 5, 2015

(54) MULTILAYERED CERAMIC CAPACITOR AND BOARD FOR MOUNTING THE SAME

(71) Applicant: Samsung Electro-Mechanics Co., Ltd., Suwon, Gyunggi-do (KR)

(72) Inventors: Min Cheol Park, Gyunggi-do (KR); Heung Kil Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 104 days.

(21) Appl. No.: 13/950,119

(22) Filed: Jul. 24, 2013

(65) Prior Publication Data
US 2014/0311788 A1     Oct. 23, 2014

(30) Foreign Application Priority Data

Apr. 22, 2013  (KR) .................. 10-2013-0044154

(51) Int. Cl.
*H05K 1/18*         (2006.01)
*H01G 4/30*         (2006.01)
*H01G 4/38*         (2006.01)

(52) U.S. Cl.
CPC ............... *H01G 4/30* (2013.01); *H05K 1/181* (2013.01); *H01G 4/385* (2013.01)

(58) Field of Classification Search
CPC .......... H01G 4/12; H01G 4/385; H05K 1/181
See application file for complete search history.

(56) References Cited

U.S. PATENT DOCUMENTS

2012/0162853 A1    6/2012   Togashi

FOREIGN PATENT DOCUMENTS

JP          2010-177572 A     8/2010
JP          2012-138415 A     7/2012

*Primary Examiner* — Jeremy C Norris
(74) *Attorney, Agent, or Firm* — McDermott Will & Emery LLP

(57) ABSTRACT

There is provided a multilayered ceramic capacitor including a ceramic body including a plurality of dielectric layers and having first and second main surfaces, first and second side surfaces, and first and second end surfaces; a first capacitor part including a first internal electrode exposed to the first end surface and a second internal electrode exposed to the second end surface, and a second capacitor part including a third internal electrode exposed to the first end surface and a fourth internal electrode exposed to the second side surface; an internal connection conductor exposed to the first and second side surfaces; and first to fourth external electrodes formed on the outer surfaces of the ceramic body and electrically connected to the first to fourth internal electrodes and the internal connection conductor, wherein the first capacitor part has capacitance larger than that of the second capacitor part.

18 Claims, 8 Drawing Sheets

A-A'

(R)

_US 9,024,206 B2_

MULTILAYERED CERAMIC CAPACITOR AND BOARD FOR MOUNTING THE SAME

CROSS-REFERENCE TO RELATED APPLICATION

This application claims the priority of Korean Patent Application No. 10-2013-0044154 filed on Apr. 22, 2013, in the Korean Intellectual Property Office, the disclosure of which is incorporated herein by reference.

BACKGROUND OF THE INVENTION

1. Field of the Invention

The present invention relates to a multilayered ceramic capacitor and a board for mounting the same.

2. Description of the Related Art

A multilayer ceramic capacitor, a multilayer chip electronic component, is a chip-shaped condenser mounted on the printed circuit boards of various electronic products such as display devices, for example, liquid crystal displays (LCDs), plasma display panels (PDPs) and the like, as well as computers, smartphones, mobile phones, and the like, to serve to charge and discharge electricity therein.

Since such a multilayer ceramic capacitor (MLCC) has advantages such as a small size, high capacitance, ease of mounting, or the like, such a multilayer ceramic capacitor may be used as a component in various electronic devices.

The multilayer ceramic capacitor may have a structure in which a plurality of dielectric layers and internal electrodes having different polarities are alternately stacked while being interposed between the dielectric layers.

In particular, a power supply device for a central processing unit (CPU) of a computer or the like may generate voltage noise due to a rapid change in a load current during a process of providing a low voltage.

In addition, as efficiency of the power supply device has been important in recent years, a rapid switching speed is required for decreasing a loss of the efficiency.

However, when the switching speed increases, a negative offset phenomenon such as an increase in electromagnetic interference (EMI) may occur.

In addition, when field effect transistors (FET) configuring a direct current (DC)/DC converter are switched, ringing occurs through inductance in a wiring and parasitic capacitance of the FET to hinder a peripheral-circuit while emitting high frequency noise.

That is, resonance is generated by the inductance of the wiring and the capacitance of a switch device in the FET, or the like, and electromagnetic interference occurs due to the high frequency power.

In particular, since analogue circuits such as power supply circuits, wireless circuits, voice circuits, or the like, may be provided to be adjacent to each other in small, portable terminals such as smartphones, tablet PCs, or the like, EMI generated thereby may hinder communications or deteriorate sound quality.

In general, research into a technology of adding a C-R snubber to the FET in order to solve the above-described problems has been conducted. However, in the method of adding the C-R snubber to the FET, power is partially consumed in the C-R snubber at the time of switching, such that conversion efficiency of the DC/DC converter may be deteriorated.

Therefore, research into a technology of decreasing noise by suppressing the ringing while preventing the deterioration in the conversion efficiency of the DC/DC converter remains required.

RELATED ART DOCUMENT

Japanese Patent Laid-Open Publication No. JP 2012-138415

SUMMARY OF THE INVENTION

An aspect of the present invention provides a multilayered ceramic capacitor and a board for mounting the same.

According to an aspect of the present invention, there is provided a multilayered ceramic capacitor including: a ceramic body including a plurality of dielectric layers and having first and second main surfaces opposing each other, first and second side surfaces opposing each other, and first and second end surfaces opposing each other; a first capacitor part including a first internal electrode exposed to the first end surface and a second internal electrode exposed to the second end surface and having a lead-out portion exposed to the first side surface, and a second capacitor part including a third internal electrode exposed to the first end surface and a fourth internal electrode having a lead-out portion exposed to the second side surface, the first capacitor part and the second capacitor part being formed in the ceramic body; an internal connection conductor formed in the ceramic body and exposed to the first and second side surfaces; and first to fourth external electrodes formed on the outer surfaces of the ceramic body and electrically connected to the first to fourth internal electrodes and the internal connection conductor, wherein the first capacitor part has capacitance larger than that of the second capacitor part.

The first and second external electrodes may be disposed on the first and second end surfaces of the ceramic body opposing each other, and the third and fourth external electrodes may be disposed on the first and second side surfaces of the ceramic body opposing each other.

Equivalent series resistance (ESR) of the multilayered ceramic capacitor may be increased in a high frequency band rather than in a low frequency band.

The internal connection conductor may be connected to the fourth internal electrode through the fourth external electrode.

The internal connection conductor may be connected to the second internal electrode through the third external electrode.

A distance by which the third external electrode and the fourth external electrode are spaced apart from each other may be 120 to 240 μm in a width direction of the ceramic body.

The equivalent series resistance (ESR) of the multilayered ceramic capacitor may be controlled by the internal connection conductor.

According to an aspect of the present invention, there is provided a multilayered ceramic capacitor including: a ceramic body including a plurality of dielectric layers and having first and second main surfaces opposing each other, first and second side surfaces opposing each other, and first and second end surfaces opposing each other; a first capacitor part including a first internal electrode exposed to the first end surface and a second internal electrode exposed to the second end surface, and a second capacitor part including a third internal electrode exposed to the first end surface and a fourth internal electrode having a lead-out portion exposed to the first side surface, and a third capacitor part including a fifth internal electrode exposed to the first end surface and a sixth internal electrode having a lead-out portion exposed to the second side surface, the first capacitor part, the second capacitor part, and the third capacitor part being formed in the ceramic body; a first internal connection conductor exposed to the second end surface and the first side surface and a second internal connection conductor exposed to the first side surface and the second side surface, the first internal connection conductor and the second internal connection conductor being formed in the ceramic body; and first to fourth external electrodes formed on the outer surfaces of the ceramic body and electrically connected to the first and sixth internal electrodes and the first and second internal connection conductors, wherein the first capacitor part has capacitance larger than those of the second and third capacitor parts.

The first and second external electrodes may be disposed on the first and second end surfaces of the ceramic body opposing each other, and the third and fourth external electrodes may be disposed on the first and second side surfaces of the ceramic body opposing each other.

Equivalent series resistance (ESR) of the multilayered ceramic capacitor may be increased in a high frequency band rather than in a low frequency band.

The first internal connection conductor may be connected to the fourth internal electrode through the third external electrode.

The first internal connection conductor may be connected to the second internal electrode through the second external electrode.

The second internal connection conductor may be connected to the sixth internal electrode through the fourth external electrode.

The second internal connection conductor may be connected to the first internal connection conductor through the third external electrode.

A distance by which the third external electrode and the fourth external electrode are spaced apart from each other may be 120 to 240 μm in a width direction of the ceramic body.

The equivalent series resistance (ESR) of the multilayered ceramic capacitor may be controlled by the first and second internal connection conductors.

According to an aspect of the present invention, there is provided a board for mounting a multilayered ceramic capacitor, the board including: a printed circuit board having first and second electrode pads disposed thereon; and the multilayered ceramic capacitor as described above installed on the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
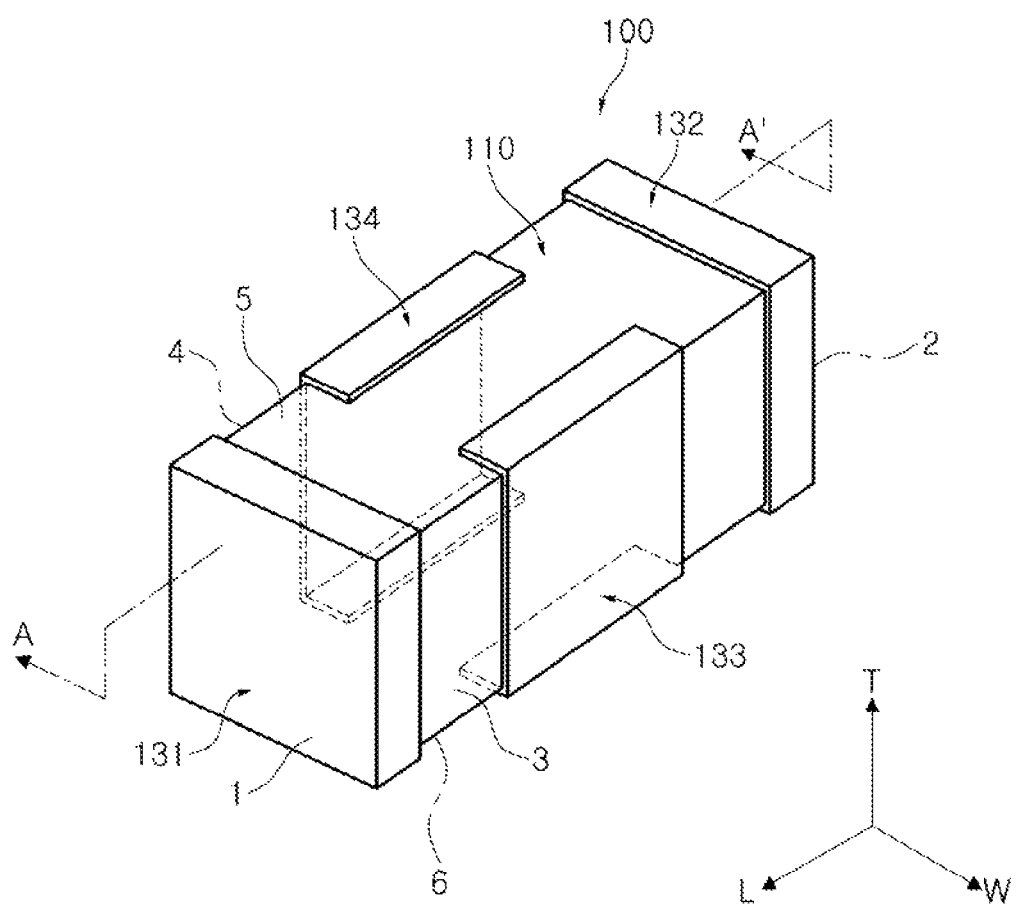
FIG. 1 is a perspective view of a multilayered ceramic capacitor according to an embodiment of the present invention.

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

When defining each direction of a hexahedron in order to clearly describe the embodiment of the present invention, L, W and T shown in the drawing refer to a length direction, a width direction, and a thickness direction, respectively. Here, a thickness direction may be used as the same meaning as a direction in which the dielectric layers are stacked.

Multilayered Ceramic Capacitor

Hereinafter, embodiments of the present invention will now be described in detail with reference to the accompanying drawings.

FIG. 1 is a perspective view of the multilayered ceramic capacitor according to the embodiment of the present invention.

Figure 2:
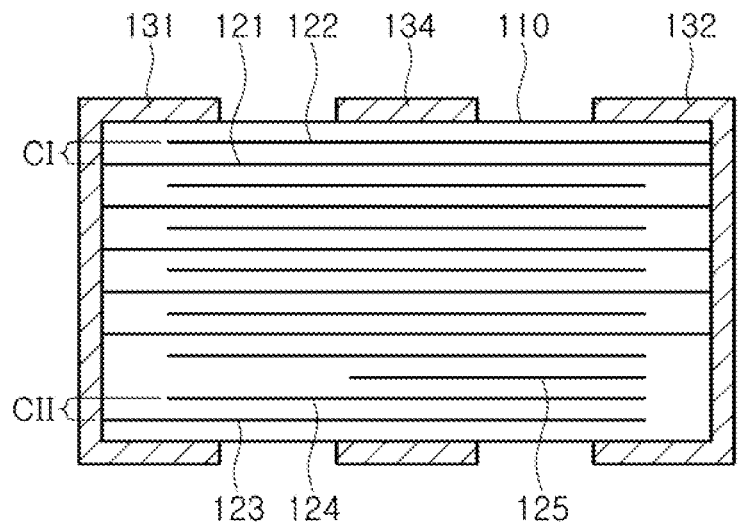
FIG. 2 is a cross-sectional view taken along line A-A' of FIG. 1.

FIG. 2 is a cross-sectional view taken along line A-A' of FIG. 1.

Figure 3:
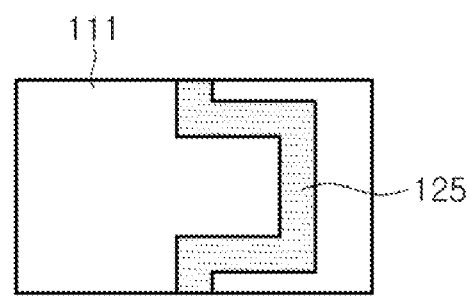
FIG. 3 is a plan view of an internal connection conductor adoptable to the multilayered ceramic capacitor shown in FIG. 1.

FIG. 3 is a plan view showing an internal connection conductor adoptable to the multilayered ceramic capacitor shown in FIG. 1.

Figure 4:
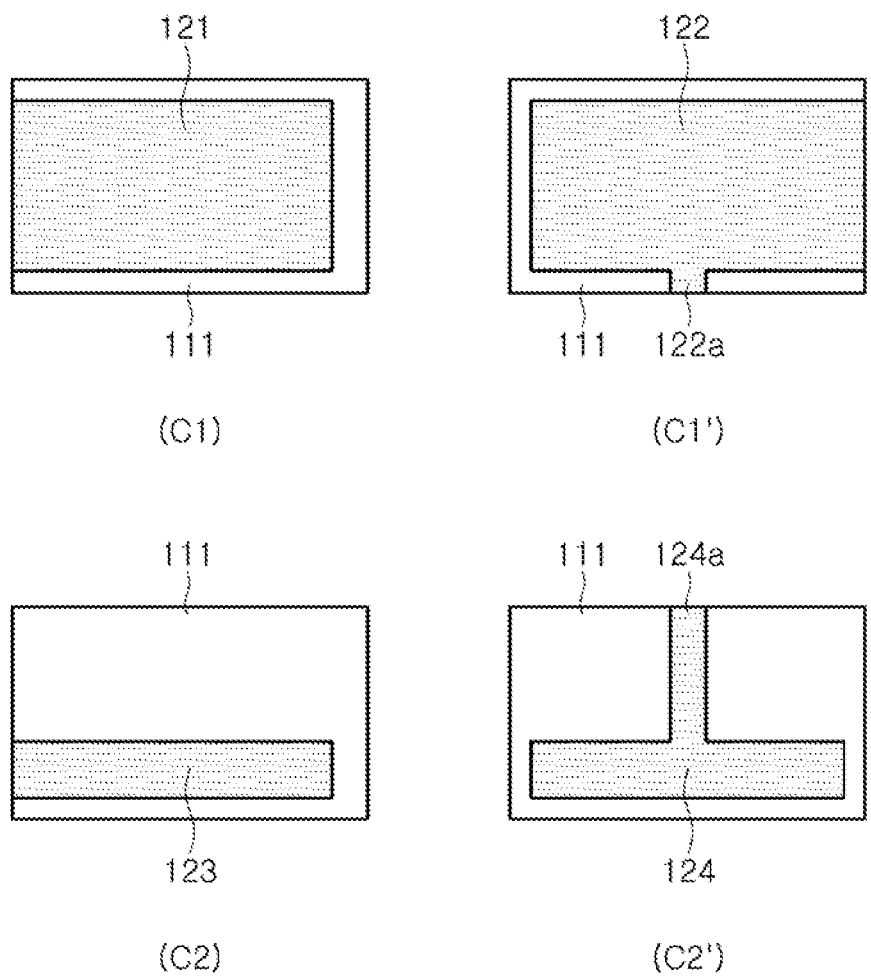
FIG. 4 is plan views showing first to fourth internal electrodes usable together with the internal connection conductor shown in FIG. 3.

FIG. 4 is plan views showing first to fourth internal electrodes usable together with the internal connection conductors shown in FIG. 3.

Referring to FIGS. 1 to 4, the multilayered ceramic capacitor 100 according to the embodiment of the present invention may include a ceramic body 110 including a plurality of dielectric layers 111, and having first and second main surfaces opposing each other, first and second side surfaces opposing each other, and first and second end surfaces opposing each other.

According to the embodiment of the present invention, the ceramic body 110 may have the first main surface 5 and the second main surface 6 opposing each other, the first side surface 3 and the second side surface 4 connecting the first main surface and the second main surface to each other, and the first end surface 1 and the second end surface 2.

The ceramic body 110 is not particularly limited, but may have a hexahedron shape as shown in drawings.

The ceramic body 110 may be formed by stacking a plurality of dielectric layers, and the plurality of internal electrodes 121, 122, 123, and 124 (the first to fourth internal electrodes in sequence) may be disposed to be spaced from each other, having the dielectric layer therebetween, in the ceramic body 110.

The plurality of dielectric layers 111 configuring the ceramic body 110 is in a sintered state and may be integrated so as not to easily discern a boundary between dielectric layers adjacent to each other.

The dielectric layer 111 may be formed by sintering a ceramic green sheet containing a ceramic powder, an organic solvent, and an organic binder. As the ceramic powder, a high k material, a barium titanate ($BaTiO_3$) based material, a strontium titanate ($SrTiO_3$) based material, or the like, may be used. However, the ceramic powder is not limited thereto.

The multilayered ceramic capacitor 100 may include a first capacitor part CI including a first internal electrode 121 exposed to the first end surface 1 and a second internal electrode 122 exposed to the second end surface 2 and having a lead-out portion 122a exposed to the first side surface 3, and a second capacitor part CII including a third internal electrode 123 exposed to the first end surface 1 and a fourth internal electrode 124 having a lead-out portion 124a exposed to the second side surface 4, the first capacitor part and the second capacitor part being formed in the ceramic body.

According to the embodiment of the present invention, the first to fourth internal electrodes 121, 122, 123, and 124 may be formed of a conductive paste containing a conductive metal.

The conductive metal may be nickel (Ni), copper (Cu), palladium (Pd), or an alloy thereof, but is not limited thereto.

An internal electrode may be printed on a ceramic green sheet configuring the dielectric layer by using a conductive paste through a printing method such as a screen printing method or a gravure printing method.

The ceramic green sheets having the internal electrode printed thereon may be alternately stacked and sintered to thereby form the ceramic body.

In addition, the multilayered ceramic capacitor 100 may be formed in the ceramic body 110, and may include the internal connection conductor 125 exposed to the first and second side surfaces 3 and 4.

The internal connection conductor 125 is not particularly limited, and for example, may be formed of a conductive paste containing a conductive metal, in a similar manner to the first to fourth internal electrodes 121, 122, 123, and 124.

The conductive metal may be nickel (Ni), copper (Cu), palladium (Pd), or an alloy thereof, but is not limited thereto.

In addition, the multilayered ceramic capacitor 100 may include first to fourth external electrodes 131, 132, 133, and 134 formed on outer surfaces of the ceramic body 110 and electrically connected to the first to fourth internal electrodes 121, 122, 123, and 124 and the internal connection conductor 125.

The first and second external electrodes 131 and 132 may be disposed on the first and second end surfaces 1 and 2 of the ceramic body 110 opposing each other, and the third and fourth external electrodes 133 and 134 may be disposed on the first and second side surfaces 3 and 4 of the ceramic body 110 opposing each other.

According to the embodiment of the present invention, it may be appreciated that two external electrodes 133 and 134 except for the first and second external electrodes 131 and 132 used as an external terminal for connecting power line may be used as an external electrode for controlling equivalent series resistance (ESR).

However, the first and second external electrodes used as the external terminal may be arbitrarily selected according to the required ESR characteristics, and thus, the first and second external electrodes are not particularly limited.

The first to fourth external electrodes 131, 132, 133, and 134 may be formed of a conductive paste containing a conductive metal.

The conductive metal may be nickel (Ni), copper (Cu), tin (Sn), or an alloy thereof, but is not limited thereto.

The conductive paste may further include an insulating material, and the insulating material is not particularly limited, but for example, may be glass.

A method of forming the first to fourth external electrodes 131, 132, 133, and 134 is not particularly limited. That is, the first to fourth external electrodes may be formed by dipping the ceramic body or by using other methods such as a plating method, and the like.

The multilayered ceramic capacitor 100 may be a four terminal capacitor having a total of four external electrodes, but the present invention is not limited thereto.

Hereinafter, configurations of internal electrodes, 121, 122, 123, and 124, internal connection conductor 125, and external electrodes 131, 132, 133, and 134 in the multilayered ceramic capacitor 100 according to the embodiment of the present invention will be described in detail with reference to FIGS. 2 to 4.

The first capacitor part CI may be formed in the ceramic body 110, and may include the first internal electrode 121 exposed to the first end surface 1 and the second internal electrode 122 exposed to the second end surface 2 and having the lead-out portion 122a exposed to the first side surface 3 to thereby form capacitance.

In addition, the second capacitor part CII may include the third internal electrode 123 exposed to the first end surface 1 and the fourth internal electrode 124 having the lead-out portion 124a exposed to the second side surface 4 to thereby form capacitance.

The first capacitor part CI and the second capacitor part CII may be disposed in the ceramic body 110 without specific limitation, and the plurality of first capacitor parts and second capacitor parts may be stacked in order to implement target capacitance.

According to the embodiment of the present invention, the first capacitor part CI may have a capacitance larger than that of the second capacitor part CII.

The capacitance of the first capacitor part CI may have a large difference from the capacitance of the second capacitor part CII, and for example, the capacitance of the first capacitor part CI may be 10 μF, and the capacitance of the second capacitor part CII may be 10 nF, but is not particularly limited thereto.

The first capacitor part CI has a large difference from the second capacitor part CII in view of capacitance as described above, such that conversion efficiency of a direct current (DC) to DC converter may not be affected, resonance may be suppressed, and noise may be decreased.

The first capacitor part CI may have relatively high capacitance to have low frequency characteristics, and the second capacitor part CII may have relatively low capacitance to have high frequency characteristics.

According to the embodiment of the present invention, equivalent series resistance (ESR) of the multilayered ceramic capacitor may be increased in a high frequency band that in a low frequency band.

Therefore, since the ESR in the low frequency band is relatively small, a ringing phenomenon may be suppressed by the ESR increased in the high frequency band to decrease the noise without consuming a switching current required for power conversion of the DC to DC converter.

According to the embodiment of the present invention, the first capacitor part CI and the second capacitor part CII may be connected in parallel in the multilayered ceramic capacitor 100.

The first to fourth internal electrodes 121, 122, 123, and 124 may be alternately disposed, having the dielectric layer 111 therebetween, together with the internal connection conductor 125.

The internal connection conductor 125 shown in FIG. 3 is shown as a single connection conductor (R), but a plurality of internal connection conductors having at least one polarity may be provided.

Similar to the internal connection conductor described above, the first to fourth internal electrodes 121, 122, 123, and 124 are shown as respective one in FIG. 4, but a plurality of internal electrodes may be actually used in the specific group (C1, C1', C2, or C2').

Meanwhile, the internal connection conductors and the internal electrodes may be stacked in a sequence shown in FIGS. 3 and 4, but may be stacked in various sequences as needed.

For example, as shown in FIG. 2, the internal connection conductor 125 may be disposed to be positioned between the first capacitor part CI and the second capacitor part CII.

According to the embodiment of the present invention, the internal connection conductor 125 may be exposed to the first side surface 3 and the second side surface 4, and may be connected to the fourth internal electrode 124 through the fourth external electrode 134, but the present invention is not limited thereto.

In addition, according to the embodiment of the present invention, the internal connection conductor 125 may be connected to the second internal electrode 122 through the third external electrode 133, but the present invention is not limited thereto.

A pattern shape of the internal connection conductor 125 shown in FIG. 3 is provided according to the embodiment of the present invention by way of example. Therefore, the internal connection conductor may have various pattern shapes in order to control the ESR.

For example, the internal connection conductor 125 shown in FIG. 3 may have the same pattern shape as those of the first to fourth internal electrodes 121, 122, 123, and 124 shown in FIG. 4.

According to the embodiment of the present invention, the ESR of the multilayered ceramic capacitor may be controlled by the internal connection conductor 125.

That is, as described below, the first capacitor part CI including the first internal electrode 121 and the second internal electrode 122 and the second capacitor part CII including the third internal electrode 123 and the fourth internal electrode 124 may be connected in parallel, and in particular, the second capacitor part CII may be connected to the internal connection conductor 125 in series.

According to the connection as described above, the ESR of the multilayered ceramic capacitor may be controlled by the internal connection conductor 125.

In addition, according to the embodiment of the present invention, the first and second external electrodes 131 and 132 may be used as an external terminal for connecting the power line, and for example, the first external electrode 131 may be connected to a power source terminal, and the second external electrode 132 may be connected to a ground.

Meanwhile, the third and fourth external electrodes 133 and 134 which are two external electrodes except for the first and second external electrodes 131 and 132 may be used as the external electrode for controlling the ESR, and may be used as non-contact terminal.

Figure 5:
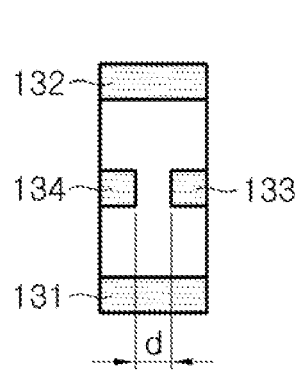
FIG. 5 is a plan view of the multilayered ceramic capacitor according to the embodiment of the present invention.

FIG. 5 is a plan view of the multilayered ceramic capacitor according to the embodiment of the present invention.

Referring to FIG. 5, a distance d by which the third external electrode 133 and the fourth external electrode 134 are spaced apart from each other may be 120 to 240 μm in a width direction of the ceramic body 110, but is not limited thereto.

The third and fourth external electrodes 133 and 134, non-contact terminals, may be used as the external electrode for controlling the ESR, and the distance d may be 120 to 240 μm in a width direction of the ceramic body 110, such that the manufactured multilayered ceramic capacitor may have a small size.

More specifically, even when the distance by which the non-contact terminals are spaced apart from each other is decreased as described above, a surface discharge phenomenon due to a leak current between electrodes is not generated.

In general, in the case of a miniaturized chip, the distance by which the non-contact terminals are spaced apart from each other is decreased as described above, such that the surface discharge phenomenon caused by the leak current between electrodes is generated.

However, according to the embodiment of the present invention, even when the distance d by which the third external electrode 133 and the fourth external electrode 134 are spaced apart from each other is decreased to be 120 to 240 μm in a width direction of the ceramic body 110, there is no problem in reliability.

Therefore, even in a circumstance in which significantly high current is used, there is no deterioration in reliability, such that a DC to DC converter having high efficiency may be implemented.

In the case in which the distance d by which the third external electrode 133 and the fourth external electrode 134 are spaced apart from each other is less than 120 μm in a width direction of the ceramic body 110, the distance d therebetween is significantly short, such that there may be problems in reliability caused by short circuit generation.

Meanwhile, a product having small size may be obtained by controlling the distance d by which the third external electrode 133 and the fourth external electrode 134 are spaced apart from each other so as to be 240 μm or less in a width direction of the ceramic body 110.

According to the embodiment of the present invention, the reason that the distance between the non-contact terminals are spaced apart from each other is decreased as described above is that the third external electrode 133 and the fourth external electrode 134 are connected only by the internal connection conductor 125, and therefore, problems of the leak current may not be generated.

Figure 6:
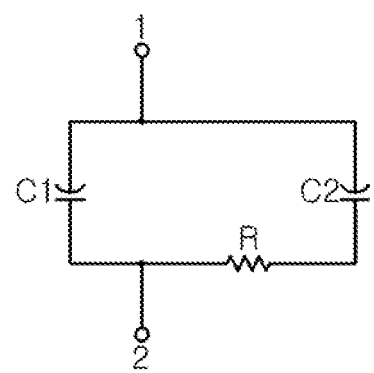
FIG. 6 is an equivalent circuit diagram of the multilayered ceramic capacitor shown in FIG. 1.

FIG. 6 is an equivalent circuit diagram of the multilayered ceramic capacitor shown in FIG. 1.

Referring to FIG. 6, the first capacitor part CI including the first internal electrode 121 and the second internal electrode 122 and the second capacitor part CII including the third internal electrode 123 and the fourth internal electrode 124 may be connected in parallel, and in particular, the second capacitor part CII may be connected to the internal connection conductor 125 in series.

As described above, the multilayered ceramic capacitor according to the embodiment of the present invention may have two types of capacitors and one type of ESR and may control respective values thereof.

The multilayered ceramic capacitor according to the embodiment of the present invention has the structure including the internal electrodes 121, 122, 123 and 124, the internal connection conductor 125, and the external electrodes as described above, such that a multilayered ceramic capacitor for the DC to DC converter in which a capacitor having a large capacitance transmits a required power, and another capacitor having a relatively small capacitance and ESR suppress the resonance may be implemented, as compared to the multilayered ceramic capacitor according to the related art.

Therefore, according to the multilayered ceramic capacitor of the embodiment of the present invention, the resonance may be suppressed and the noise may be decreased without having an influence on the conversion efficiency as compared to the multilayered ceramic capacitor according to the related art.

In addition, since the ESR is decreased in a low frequency band and the ESR is increased in a high frequency band in the multilayered ceramic capacitor according to the embodiment of the present invention, a ringing phenomenon may be suppressed by the increased ESR in the high frequency band without consuming the switching current required for the power conversion of the DC to DC converter.

Further, according to the multilayered ceramic capacitor having the above-described structure, an interval between non-contact terminals is reduced to allow components to have smaller sizes, thereby being used at a relatively high current and reducing a mounting space and cost.

Figure 7:
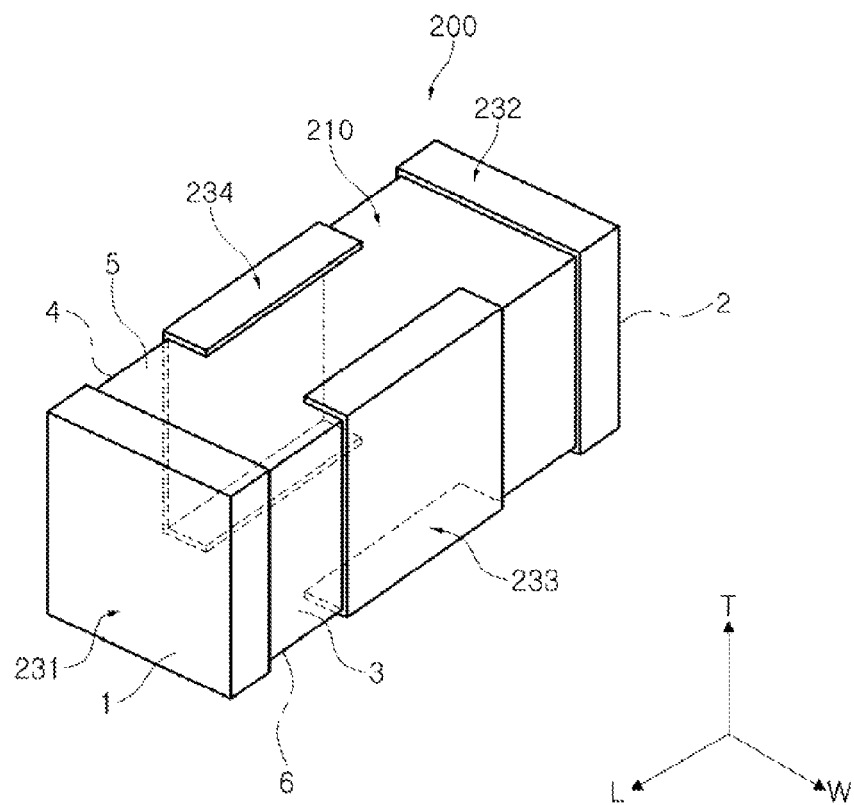
FIG. 7 is a perspective view of a multilayered ceramic capacitor according to an embodiment of the present invention.

FIG. 7 is a perspective view of the multilayered ceramic capacitor according to an embodiment of the present invention.

Figure 8:
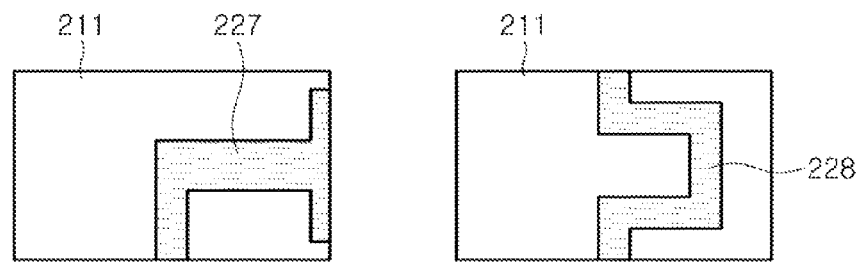
FIG. 8 is plan views showing the first and second internal connection conductors adoptable to the multilayered ceramic capacitor shown in FIG. 7.

FIG. 8 is plan views showing first and second internal connection conductors adoptable to the multilayered ceramic capacitor shown in FIG. 7.

Figure 9:
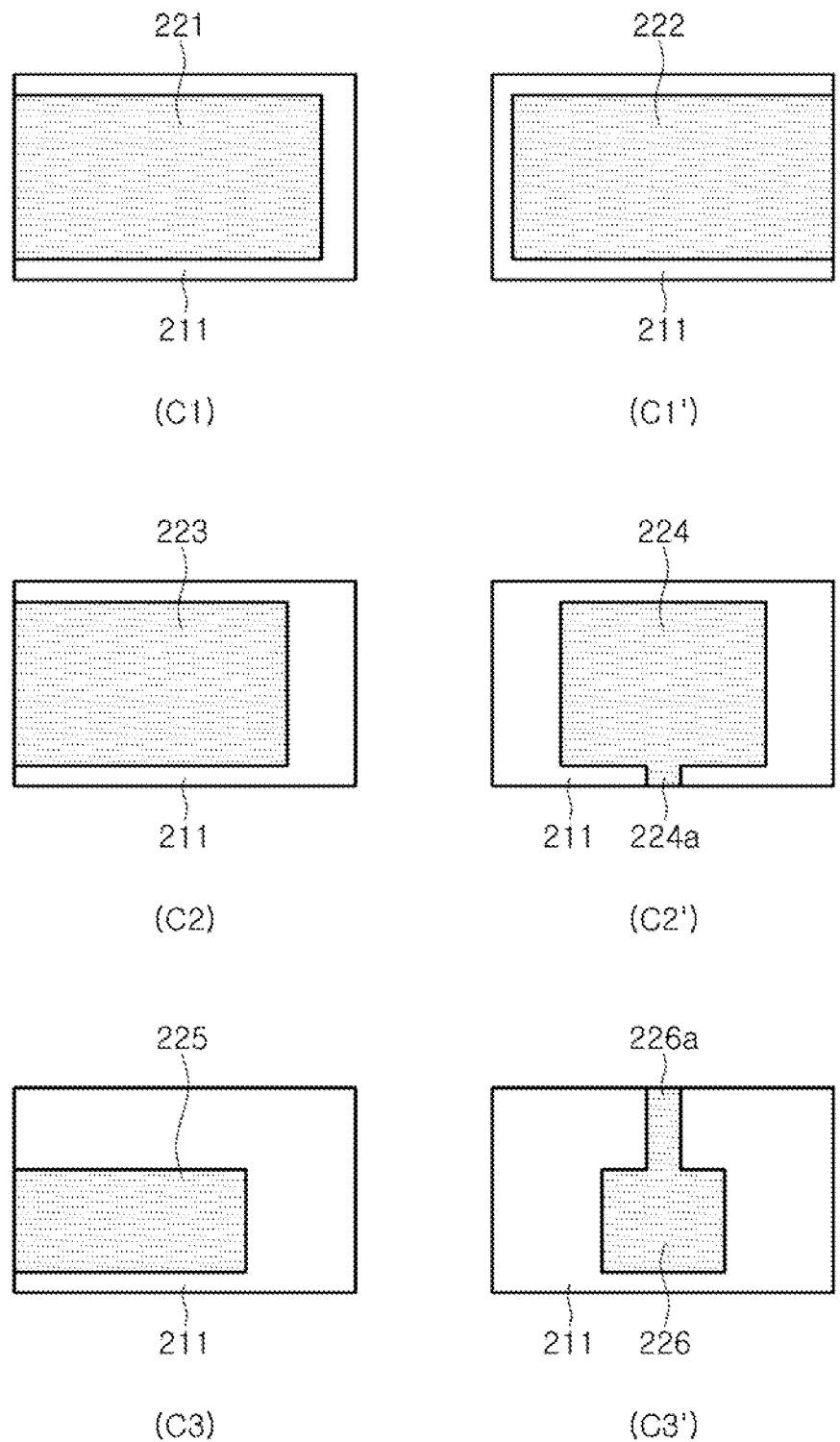
FIG. 9 is plan views showing first to fourth internal electrodes usable together with the first and second internal connection conductors shown in FIG. 8.

FIG. 9 is plan views showing first to fourth internal electrodes usable together with the first and second internal connection conductors shown in FIG. 8.

Referring to FIGS. 7 to 9, a multilayered ceramic capacitor 200 according to another embodiment of the present invention may include: a ceramic body 210 including a plurality of dielectric layers 211, and having first and second main surfaces opposing each other, first and second side surfaces opposing each other, and first and second end surfaces opposing each other; a first capacitor part including a first internal electrode 221 exposed to the first end surface and a second internal electrode 222 exposed to the second end surface, a second capacitor part including a third internal electrode 223 exposed to the first end surface and a fourth internal electrode 224 having a lead-out portion 224a exposed to the first side surface, and a third capacitor part including a fifth internal electrode 225 exposed to the first end surface and a sixth internal electrode 226 having a lead-out portion 226a exposed to the second side surface, the first capacitor part, the second capacitor part, and the third capacitor part being formed in the ceramic body 210; a first internal connection conductor 227 exposed to the second end surface and the first side surface and a second internal connection conductor 228 exposed to the first side surface and the second side surface, the first internal connection conductor and the second internal connection conductor being formed in the ceramic body 210; and first to fourth external electrodes 231, 232, 233, and 234 formed on the outer surfaces of the ceramic body 210 and electrically connected to the first to sixth internal electrodes and the first and second internal connection conductors, wherein the first capacitor part has capacitance larger than those of the second and third capacitor parts.

A description of the multilayered ceramic capacitor according to another embodiment of the present invention, the same as the multilayered ceramic capacitor according to the above-described embodiment of the present invention, will be omitted in order to avoid the overlapped portions.

According to another embodiment of the present invention, the first capacitor part may include the first internal electrode 221 exposed to the first end surface and the second internal electrode 222 exposed to the second end surface, and the second capacitor part may include the third internal electrode 223 exposed to the first end surface and the fourth internal electrode 224 having the lead-out portion 224a exposed to the first side surface.

In addition, the third capacitor part may include the fifth internal electrode 225 exposed to the first end surface and the sixth internal electrode 226 having the lead-out portion 226a exposed to the second side surface.

The capacitance of the first capacitor part may be larger than those of the second and third capacitor parts, but the present invention is not necessarily limited thereto.

Meanwhile, according to another embodiment of the present invention, the first internal connection conductor 227 may be connected to the fourth internal electrode 224 through the third external electrode 233.

According to the embodiment of the present invention, the first internal connection conductor 227 may be connected to the second internal electrode 222 through the second external electrode 232.

According to the embodiment of the present invention, the second internal connection conductor 228 may be connected to the sixth internal electrode 226 through the fourth external electrode 234.

According to the embodiment of the present invention, the second internal connection conductor 228 may be connected to the first internal connection conductor 227 through the third external electrode 233.

Figure 10:
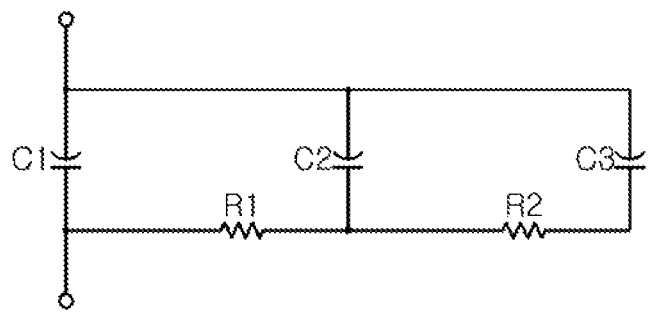
FIG. 10 is an equivalent circuit diagram of a multilayered ceramic capacitor according to another embodiment of the present invention.

FIG. 10 is an equivalent circuit diagram of a multilayered ceramic capacitor according to another embodiment of the present invention.

Referring to FIG. 10, the first capacitor part including the first internal electrode 221 and the second internal electrode 222, the second capacitor part including the third internal electrode 223 and the fourth internal electrode 224, and the third capacitor part including the fifth internal electrode 225 and the sixth internal electrode 226 may be connected in parallel, and in particular, the second capacitor part may be connected to the first internal connection conductor 227 in series, and the third capacitor part may be connected to the second internal connection conductor 228 in series.

The following Table 1 shows a comparison result of an electrostatic discharge test according to the distance by which the third external electrode and the fourth external electrode are spaced apart from each other in Inventive Example and Comparative Example of the present invention.

Multilayered ceramic capacitors manufactured according to the embodiment of the present invention were used for Inventive Examples, and general multilayered ceramic capacitors were used for Comparative Examples.

The electrostatic discharge test was performed on respective twenty samples in Inventive Example and Comparative Example, and the test was performed under a general test condition, while 4 KV voltage is applied to the multilayered ceramic capacitor.

TABLE 1

| Distance (d) (μm) | Comparative Example | Inventive Example |
|---|---|---|
| 120 | 17 | 0 |
| 160 | 13 | 0 |
| 200 | 6 | 0 |
| 240 | 3 | 0 |
| 280 | 0 | 0 |
| 320 | 0 | 0 |

Referring to the above Table 1, it may be appreciated that when the distance by which the third external electrode and the fourth external electrode are spaced apart from each other is 120 to 240 μm, the surface discharge phenomenon caused by the leak current between the electrodes was not generated in the case of Inventive Example of the present invention, and thus there was no problem in reliability.

However, it may be appreciated that when the distance by which the third external electrode and the fourth external electrode are spaced apart from each other is 120 to 240 μm, the surface discharge phenomenon caused by the leak current between the electrodes was generated in the case of Comparative Example of the present invention, and thus there was a problem in reliability.

Board for Mounting Multilayered Ceramic Capacitor

Figure 11:
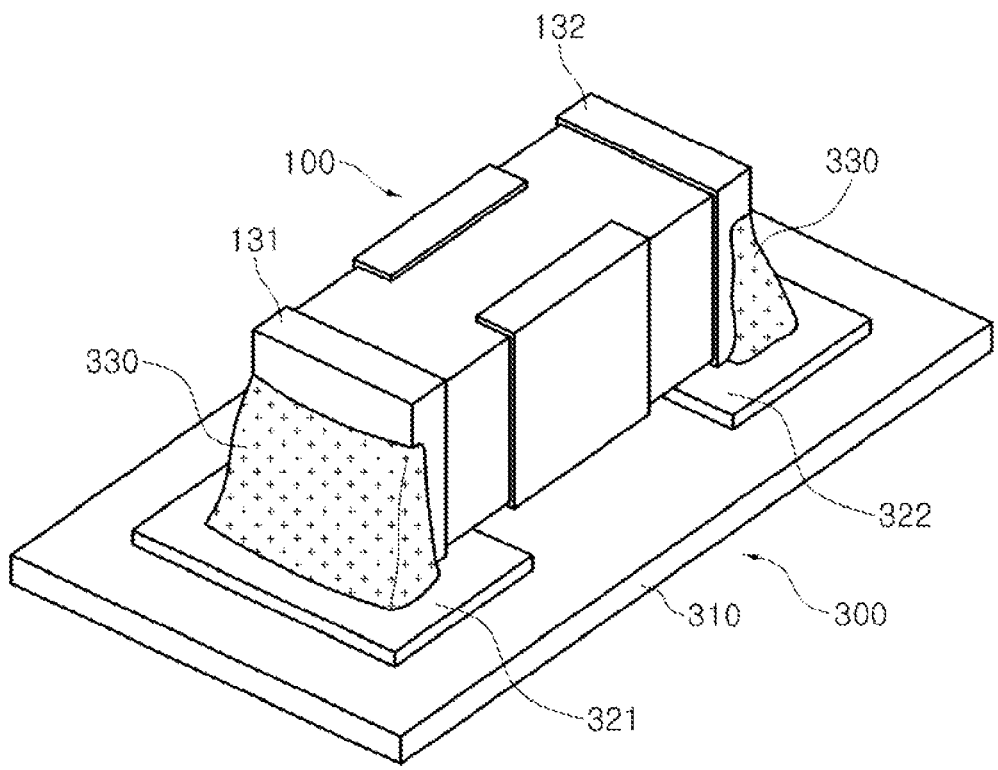
FIG. 11 is a perspective view showing a state in which the multilayered ceramic capacitor of FIG. 1 is mounted on a printed circuit board.

FIG. 11 is a perspective view showing a state in which the multilayered ceramic capacitor of FIG. 1 is mounted on a printed circuit board.

Figure 12:
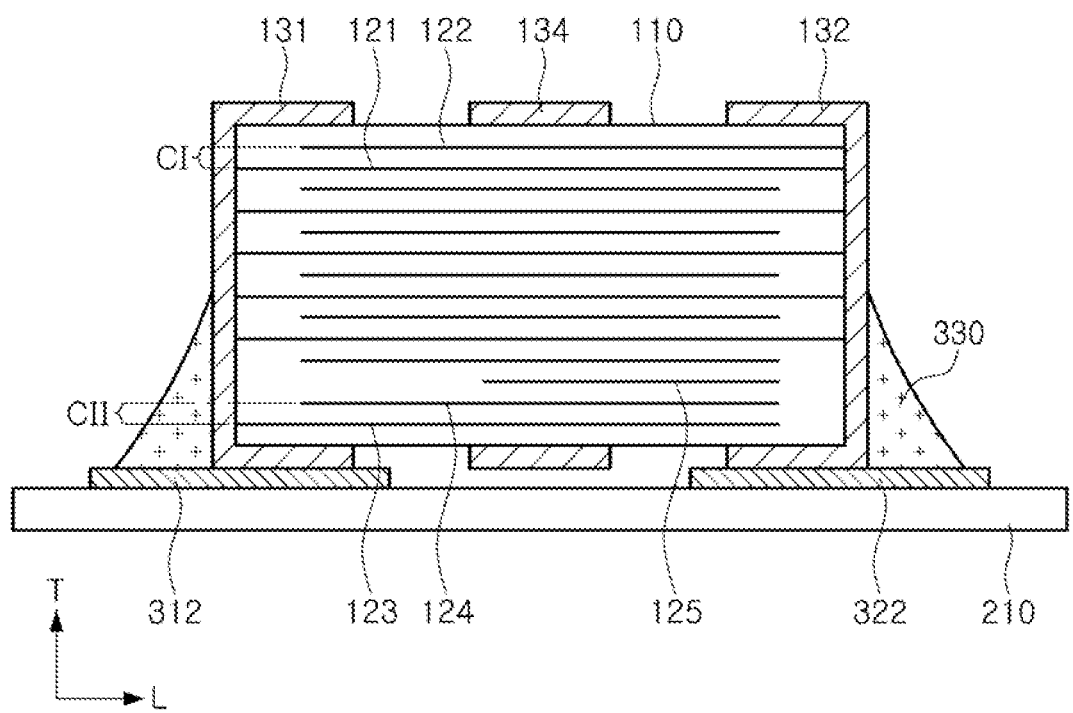
FIG. 12 is an exploded cross-sectional view showing the multilayered ceramic capacitor and the printed circuit board of FIG. 11 taken in a length direction.

FIG. 12 is an exploded cross-sectional view showing the multilayered ceramic capacitor and the printed circuit board of FIG. 11 taken in a length direction.

Referring to FIGS. 11 and 12, a board 300 for mounting the multilayered ceramic capacitor 100 according to the embodiment of the present invention may include: a printed circuit board 310 having the multilayered ceramic capacitor 100 mounted thereon so as to be in parallel, and first and second electrode pads 321 and 322 formed on the printed circuit board 310 so as to be spaced apart from each other.

Here, the multilayered ceramic capacitor 100 may be electrically connected to the printed circuit board 310 by a soldering 330 in a state in which the first and second external electrodes 131 and 132 are positioned so as to contact the first and second electrode pads 321 and 322, respectively.

An overlapped description of the multilayered ceramic capacitor according to the embodiment of the present invention, except for the above description, will be omitted.

Figure 13:
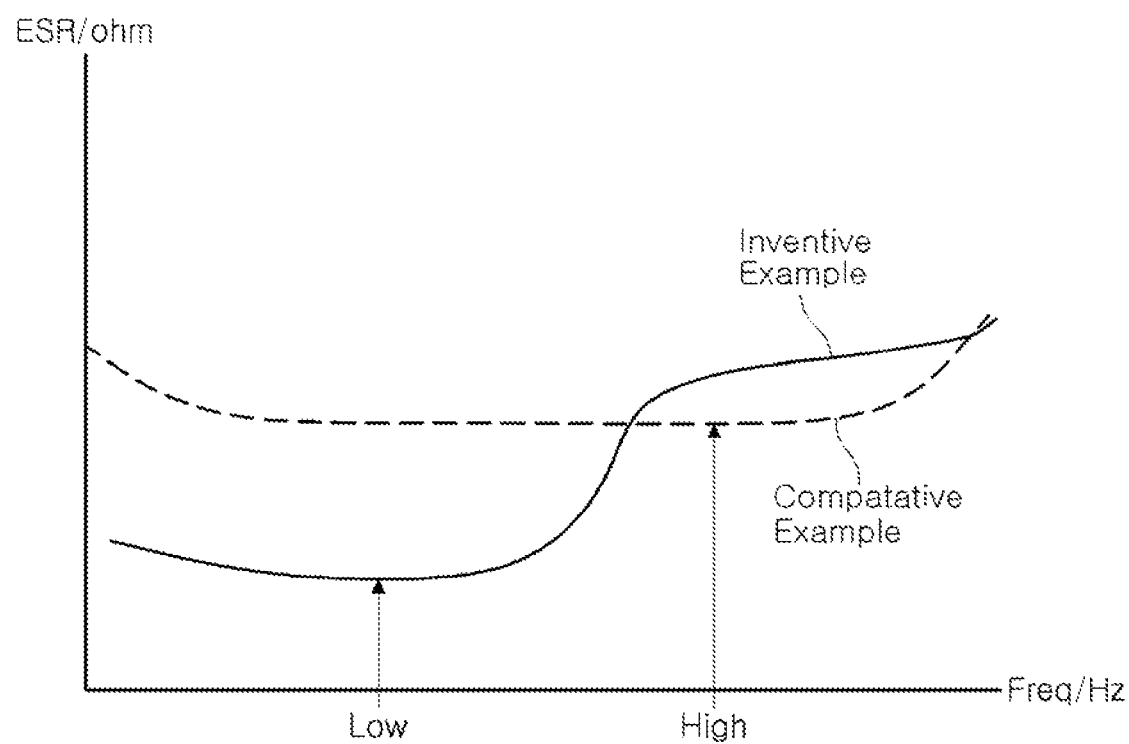
FIG. 13 is a graph showing a comparison of equivalent series resistance (ESR) between Inventive Example and Comparative Example of the present invention.

FIG. 13 is a graph showing a comparison of equivalent series resistance (ESR) between Inventive Example and Comparative Example of the present invention.

Referring to FIG. 13, in the multilayered ceramic capacitor according to the embodiment of the present invention, since the ESR is decreased in the low frequency band and the ESR is further increased in the high frequency band, the ringing phenomenon may be suppressed by the increased ESR in the high frequency band without consuming the switching current required for power conversion of the DC to DC converter, as compared to the multilayered ceramic capacitor according to the related art.

As set forth above, according to the embodiment of present invention, the multilayered ceramic capacitor for the DC to DC converter in which the capacitor having a large capacitance transmits the required power, and another capacitor having a relatively small capacitance and the ESR suppress the resonance, may be implemented.

Therefore, according to the multilayered ceramic capacitor of the embodiment of the present invention, the resonance may be suppressed and the noise may be decreased without having an influence on the conversion efficiency as compared to the multilayered ceramic capacitor according to the related art.

In addition, with the multilayered ceramic capacitor according to the embodiment of the present invention, since the ESR is decreased in the low frequency band and the ESR is increased in the high frequency band, the ringing phenomenon may be suppressed by the increased ESR in the high frequency band without consuming the switching current required for power conversion of the DC to DC converter.

Further, with the multilayered ceramic capacitor having the above-described structure according to the embodiment of the present invention, the interval between the non-contact terminals is reduced to allow the components to have smaller sizes, thereby being used at a relatively high current and reducing the mounting space and the cost.

While the present invention has been shown and described in connection with the embodiments, it will be apparent to those skilled in the art that modifications and variations can be made without departing from the spirit and scope of the invention as defined by the appended claims.

What is claimed is:

1. A multilayered ceramic capacitor comprising:
   a ceramic body including a plurality of dielectric layers and having first and second main surfaces opposing each other, first and second side surfaces opposing each other, and first and second end surfaces opposing each other;
   a first capacitor part including a first internal electrode exposed to the first end surface and a second internal electrode exposed to the second end surface and having a lead-out portion exposed to the first side surface, and a second capacitor part including a third internal electrode exposed to the first end surface and a fourth internal electrode having a lead-out portion exposed to the second side surface, the first capacitor part and the second capacitor part being formed in the ceramic body;
   an internal connection conductor formed in the ceramic body and exposed to the first and second side surfaces; and
   first to fourth external electrodes formed on the outer surfaces of the ceramic body and electrically connected to the first to fourth internal electrodes and the internal connection conductor,
   wherein the first capacitor part has capacitance larger than that of the second capacitor part.

2. The multilayered ceramic capacitor of claim 1, wherein the first and second external electrodes are disposed on the first and second end surfaces of the ceramic body opposing each other, and the third and fourth external electrodes are disposed on the first and second side surfaces of the ceramic body opposing each other.

3. The multilayered ceramic capacitor of claim 1, wherein equivalent series resistance (ESR) of the multilayered ceramic capacitor is increased in a high frequency band rather than in a low frequency band.

4. The multilayered ceramic capacitor of claim 1, wherein the internal connection conductor is connected to the fourth internal electrode through the fourth external electrode.

5. The multilayered ceramic capacitor of claim 4, wherein the internal connection conductor is connected to the second internal electrode through the third external electrode.

6. The multilayered ceramic capacitor of claim 1, wherein a distance by which the third external electrode and the fourth external electrode are spaced apart from each other is 120 to 240 μm in a width direction of the ceramic body.

7. The multilayered ceramic capacitor of claim 1, wherein the equivalent series resistance (ESR) of the multilayered ceramic capacitor is controlled by the internal connection conductor.

8. A board for mounting a multilayered ceramic capacitor, the board comprising:
   a printed circuit board having first and second electrode pads disposed thereon; and
   the multilayered ceramic capacitor according to claim 1 installed on the printed circuit board.

9. A multilayered ceramic capacitor comprising:
   a ceramic body including a plurality of dielectric layers and having first and second main surfaces opposing each other, first and second side surfaces opposing each other, and first and second end surfaces opposing each other;
   a first capacitor part including a first internal electrode exposed to the first end surface and a second internal electrode exposed to the second end surface, and a second capacitor part including a third internal electrode exposed to the first end surface and a fourth internal electrode having a lead-out portion exposed to the first side surface, and a third capacitor part including a fifth internal electrode exposed to the first end surface and a sixth internal electrode having a lead-out portion exposed to the second side surface, the first capacitor part, the second capacitor part and the third capacitor part being formed in the ceramic body;
   a first internal connection conductor exposed to the second end surface and the first side surface and a second internal connection conductor exposed to the first side surface and the second side surface, the first internal connection conductor and the second internal connection conductor being formed in the ceramic body; and
   first to fourth external electrodes formed on the outer surfaces of the ceramic body and electrically connected to the first and sixth internal electrodes and the first and second internal connection conductors,
   wherein the first capacitor part has capacitance larger than those of the second and third capacitor parts.

10. The multilayered ceramic capacitor of claim 9, wherein the first and second external electrodes are disposed on the first and second end surfaces of the ceramic body opposing each other, and the third and fourth external electrodes are disposed on the first and second side surfaces of the ceramic body opposing each other.

11. The multilayered ceramic capacitor of claim 9, wherein equivalent series resistance (ESR) of the multilayered ceramic capacitor is increased in a high frequency band rather than in a low frequency band.

12. The multilayered ceramic capacitor of claim 9, wherein the first internal connection conductor is connected to the fourth internal electrode through the third external electrode.

13. The multilayered ceramic capacitor of claim 12, wherein the first internal connection conductor is connected to the second internal electrode through the second external electrode.

14. The multilayered ceramic capacitor of claim 9, wherein the second internal connection conductor is connected to the sixth internal electrode through the fourth external electrode.

15. The multilayered ceramic capacitor of claim 14, wherein the second internal connection conductor is connected to the first internal connection conductor through the third external electrode.

16. The multilayered ceramic capacitor of claim 9, wherein a distance by which the third external electrode and the fourth external electrode are spaced apart from each other is 120 to 240 μm in a width direction of the ceramic body.

17. The multilayered ceramic capacitor of claim 9, wherein the equivalent series resistance (ESR) of the multilayered ceramic capacitor is controlled by the first and second internal connection conductors.

18. A board for mounting a multilayered ceramic capacitor, the board comprising:
   a printed circuit board having first and second electrode pads disposed thereon; and
   the multilayered ceramic capacitor according to claim 9 installed on the printed circuit board.

* * * * *